United States Patent
Fratin et al.

[19]

[11] Patent Number: 5,915,185
[45] Date of Patent: Jun. 22, 1999

[54] METHOD OF PRODUCING MOSFET TRANSISTORS BY MEANS OF TILTED IMPLANTS

[75] Inventors: Lorenzo Fratin, Buccinasco; Carlo Riva, Renate, both of Italy

[73] Assignee: SGS-Thomson Microelectronics S.r.l., Agrate Brianza, Italy

[21] Appl. No.: 09/062,859

[22] Filed: Apr. 20, 1998

[30] Foreign Application Priority Data

Apr. 21, 1997 [EP] European Pat. Off. .............. 97830182

[51] Int. Cl.[6] ...................... H01L 21/336; H01L 21/3205
[52] U.S. Cl. ........................... 438/302; 438/525; 438/307
[58] Field of Search .................................. 438/302, 307, 438/525, 529

[56] References Cited

U.S. PATENT DOCUMENTS

| | | | |
|---|---|---|---|
| 4,404,233 | 9/1983 | Ikeda et al. ................................. | 427/35 |
| 4,771,012 | 9/1988 | Yabu et al. ................................. | 437/29 |
| 4,877,962 | 10/1989 | Ohsaki et al. ...................... | 250/442.11 |
| 4,921,812 | 5/1990 | Nagai ......................................... | 437/35 |
| 5,308,780 | 5/1994 | Chou et al. ................................. | 437/44 |
| 5,459,085 | 10/1995 | Pasen et al. ................................ | 437/35 |
| 5,534,449 | 7/1996 | Dennison et al. ......................... | 437/34 |
| 5,554,544 | 9/1996 | Hsu ............................................ | 437/35 |
| 5,578,509 | 11/1996 | Fujita ........................................ | 437/35 |

FOREIGN PATENT DOCUMENTS 2 204 446   11/1988   United Kingdom .......... H01L 21/265

OTHER PUBLICATIONS

"Ion Implantation for Preventing Ion Channeling", IBM Technical Disclosure Bulletin, vol. 33, No. 10A, Mar. 1, 1991, p. 346.
Patent Abstracts of Japan, vol. 009, No. 225 (E–342), Sep. 11, 1985.
Hindmarsch, "Complex gate Performance Improvement by Jog Insertion Into Transistor Gates", Proceedings of the International Conference on Computer Design: VLSI in Computers and Processors, IEEE, Oct. 3, 1993, pp. 543–546.

*Primary Examiner*—Donald L. Monin, Jr.
*Assistant Examiner*—Daniel H. Mao
*Attorney, Agent, or Firm*—Allen, Dyer, Doppelt, Milbrath & Gilchrist, P.A.

[57] ABSTRACT

The method includes the following steps: delimiting active areas on a substrate, forming gate electrodes insulated from the substrate on the active areas, and subjecting the front surface of the substrate to several implantation steps with doping ion beams to form source and drain regions with the use of the gate electrodes as masks. The direction of the implantation beam is defined by an angle of inclination to the front surface and by an orientation to a reference line on the front surface. To avoid performing numerous implantation steps without foregoing channels of uniform and constant length, the widths of the gate electrode strips are determined at the design stage in relation to the orientation of the strips to the reference line and on the orientation of the directions of the implant beams.

18 Claims, 3 Drawing Sheets

METHOD OF PRODUCING MOSFET TRANSISTORS BY MEANS OF TILTED IMPLANTS

FIELD OF THE INVENTION

The present invention relates to the manufacture of integrated circuits and, more particularly, to a method of manufacturing insulated-gate field-effect transistors (IGFETs) or MOSFETs.

BACKGROUND OF THE INVENTION

To form source and drain regions on active areas defined on a substrate of semiconductor material on which the gate electrodes have been formed, a recent technique (large-angle tilted-implant diffusion: LATID) provides for doping ions to be implanted at angles which deviate considerably, for example by 45°, from a direction perpendicular to the surface of the substrate. In comparison with normal perpendicular implantation, this technique favors penetration of the dopant under the gate electrode and hence reduction of the distance between source and drain, that is, of the channel length, and improves the coupling between the gate electrode and the source and drain junctions. This technique is particularly advantageous when very small transistors (with channel lengths less than 1 $\mu$m) are to be produced.

Continuously rotating implanting devices in which the doses of dopant to be implanted and the geometrical parameters (inclination of the beam of ions to be implanted, orientation of the beam to a reference line, speed of rotation) are regulated and supervised automatically have been constructed for performing tilted implants of this type. However, this equipment is very expensive.

Conventional fixed implanting devices may be used to obtain essentially the same results, the implantation being performed in several successive steps with a constant angle of inclination, but different orientations of the ion beam so as to achieve substantially uniform penetration of the dopant under the gate electrodes for any orientation of the strip which is to define the gate electrode. Typically, eight or sixteen implantation steps are performed with beam directions, or rather perpendicular projections of the beam onto the front surface of the substrate, arranged 45° or 22.5° apart, respectively. However, this method requires a fairly long processing time and, naturally, a corresponding long period of using the implanting device.

SUMMARY OF THE INVENTION

An object of the present invention is to provide a production method of the type defined above which does not require such long process times, but which ensures the necessary uniformity of the doping characteristics.

This and other objects in accordance with the present invention are achieved by a method of producing insulated-gate field-effect transistors on a substrate of semiconductor material comprising the steps of: forming at least one gate electrode electrically insulated from the substrate; and subjecting the surface of the substrate to implantation of a dopant with ion beams to form in the substrate, on opposing sides of the at least one gate electrode, a pair of source and drain regions separated from one another by a channel and with the respective gate electrode being used as a mask. Each ion beam preferably comes from a predetermined direction defined by an angle of inclination to the surface of the substrate and an angle of orientation of a perpendicular projection of the predetermined direction on the surface relative to a reference line. Moreover, the at least one gate electrode may comprise a plurality of portions, and wherein the formation of the at least one gate electrode provides for respective widths of the gate electrode portions to be determined in relation to the orientation relative to the reference line and on the angles of orientation of each predetermined direction. The portions may be different gate electrodes or parts of a single gate electrode at different angles of orientation. Accordingly, uniform channel widths can be obtained.

In addition, a difference between the angle of orientation of each direction and that of the adjacent directions is preferably less than 180°. In one embodiment of the invention, there are three predetermined directions. In another embodiment there are four predetermined directions, and the difference between the orientation of each predetermined direction and that of adjacent predetermined directions is about 90°.

BRIEF DESCRIPTION OF THE DRAWINGS

The invention will be understood better from the following detailed description of an embodiment thereof, given by way of non-limiting example, with reference to the appended drawings, in which.

DETAILED DESCRIPTION OF THE PREFERRED EMBODIMENTS

Figure 1:
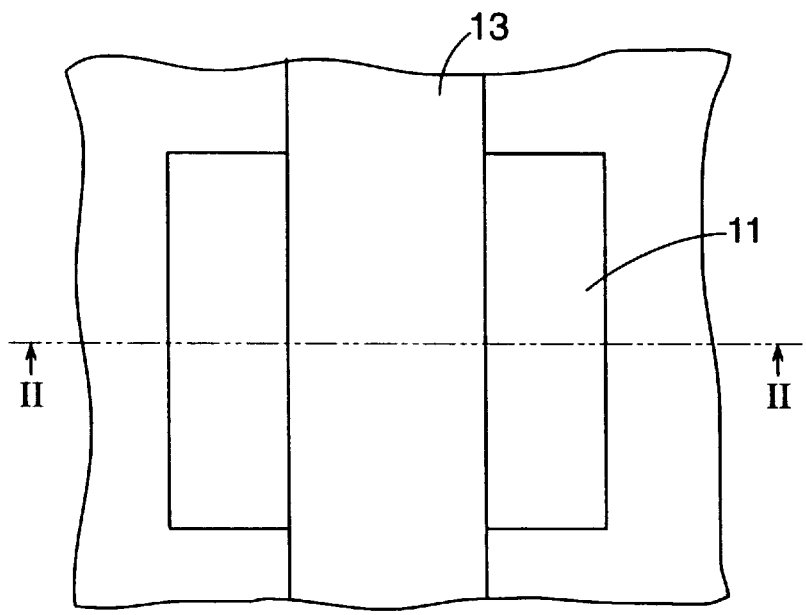
FIG. 1 shows, in plan, a portion of a silicon substrate which contains an active area and a gate electrode.
Figure 2:
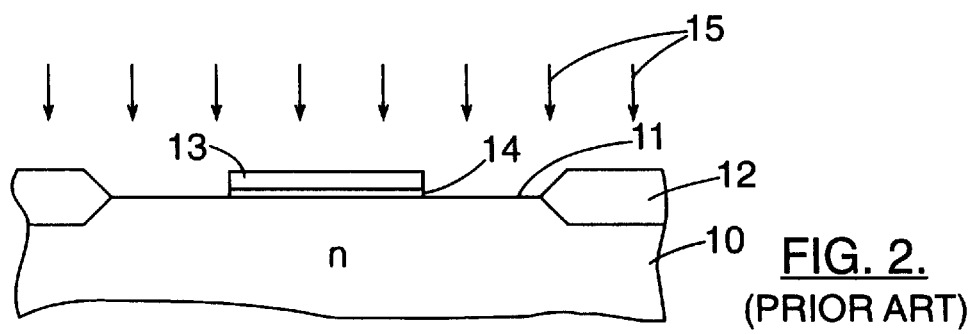
FIG. 2 is a cross-section of the structure of FIG. 1, FIGS. 3 and 4 are sections similar to FIG. 2, at subsequent processing stages.

FIGS. 1 and 2 show a portion of a silicon substrate 10 doped with n-type impurities and, more precisely, a portion delimiting a so-called active area 11, that is, an area which is insulated from the other areas of the substrate surface by silicon dioxide portions 12. This area is intended to contain one or more, in this embodiment one, insulated-gate field-effect transistor. A strip 13, for example, of polycrystalline silicon, is formed on the active area 11 and is separated from the surface of the substrate 10 by a thin layer 14 of dielectric material, for example, silicon dioxide. The strip 13 and the dielectric 14 provide, respectively, the gate electrode and the gate dielectric of a MOS field-effect transistor to be produced.

Figure 3:
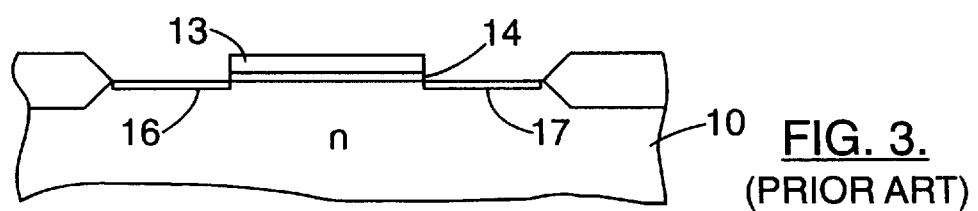
Figure 4:
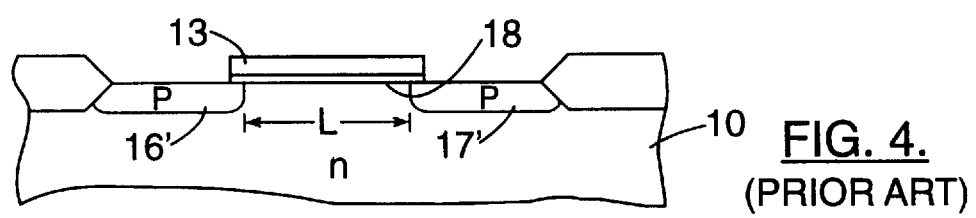

As is known to form the source and drain regions of the transistor, dopants, for example boron, are introduced through the active area with the use of the gate electrode as a mask. This operation is performed by the implantation of ions of the dopant with an energy and a dose which are determined by the depth and concentration of the source and drain regions to be produced. The ion beam, indicated by arrows 15, is usually perpendicular to the front surface of the wafer, as shown in FIG. 2, so as to produce p-type doped regions 16, 17, substantially aligned with the edges of the gate electrode, that is, with the parallel sides of the polycrystalline silicon strip 13 (FIG. 3). Any subsequent exposure of the substrate to high temperature causes diffusion of the implanted dopants even beneath the edge regions of the electrode 13. The source and drain regions 16' and 17' of the transistor are thus produced, as shown in FIG. 4.

The channel of the transistor is defined by the thin surface region 18 disposed beneath the strip 13 and is delimited by the parallel edges of the source and drain regions 16' and 17'. The length L of the channel defines the distance between the facing edges of the source and drain regions. The length of the channel is therefore slightly less than the width of the gate-electrode strip 13.

To produce ever smaller transistors, it is necessary to reduce the length of the channel. The minimum limit of this length is determined by the minimum achievable width of the strip which is to provide the gate electrode. This limit is determined by the resolution of the photolithographic techniques used. The minimum channel length achievable by current techniques using implantation with ion beams perpendicular to the substrate is about 0.5 µm.

Figure 5:
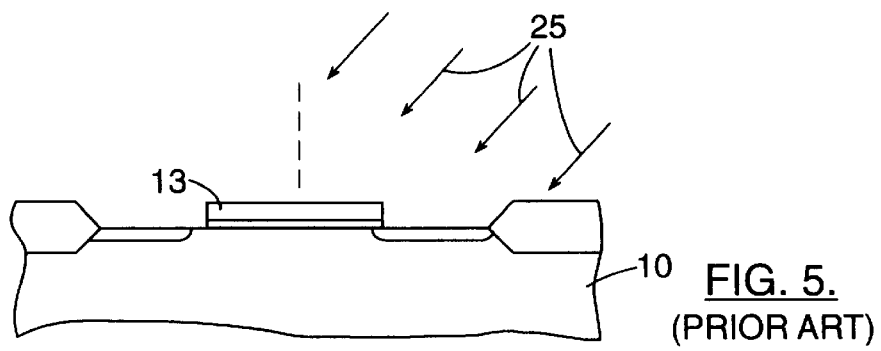
FIGS. 5 and 6 show sections of a portion of a substrate similar to that of FIGS. 1 to 4 which has undergone two tilted-implantation steps.
Figure 6:
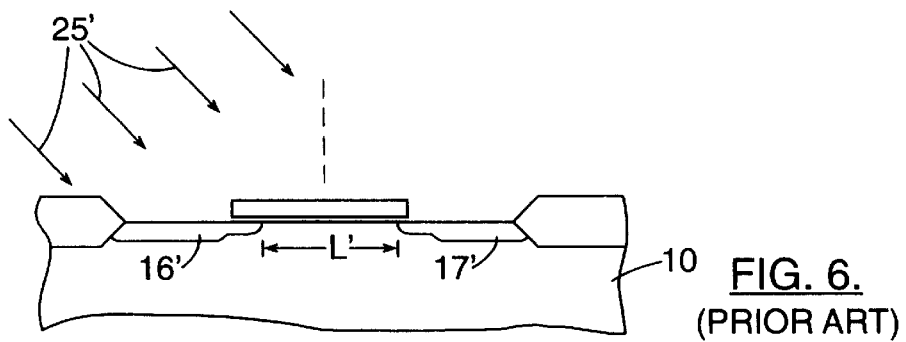

The LATID implant techniques mentioned in the background of the invention section were proposed to go below this limit. FIGS. 5 and 6, in which elements identical or corresponding to those of FIGS. 1 to 4 are indicated by the same reference numerals, show the effect of implantation by means of an ion beam 25 inclined at +45° to a plane perpendicular to the front surface of the substrate and intersecting this surface on a straight line parallel to the length of the gate strip 13. If a further implantation step is carried out on the same wafer with an ion beam 25' with the same energy and the same dose of dopant, but inclined at −45° to the above-defined plane, a structure such as that shown in FIG. 6 is obtained. A symmetrical structure is obtained in which the channel length L' is less than that which can be achieved with perpendicular implantation if other conditions remain the same.

Clearly, when it is necessary to form, on the same substrate, transistors of which the channels, and hence the respective gate-electrode strips, may be oriented in any manner or, in any case, at different angles to a reference line on the surface of the substrate, the implantation has to be performed with changes in the orientation of the ion beam to the reference line. Maximum uniformity is obtained with a continuously rotating implanting device, but good results are also obtained by subjecting the substrate to numerous successive implantation steps with uniformly-spaced orientations. Naturally, the implantation energy and dose have to be determined so as to account for the cumulative effect of the various implantation steps. As stated above, both of these techniques have serious disadvantages.

In the embodiment described below, reference is made to a method with four implantation steps carried out at 90° angular intervals, which has been found advantageous in a particular application. The invention may, however, also be implemented with three implantation steps or with more than four implantation steps, provided that, in the various implantation steps, the difference between the orientation of each beam direction and that of the adjacent direction is less than 180°.

Figure 7:
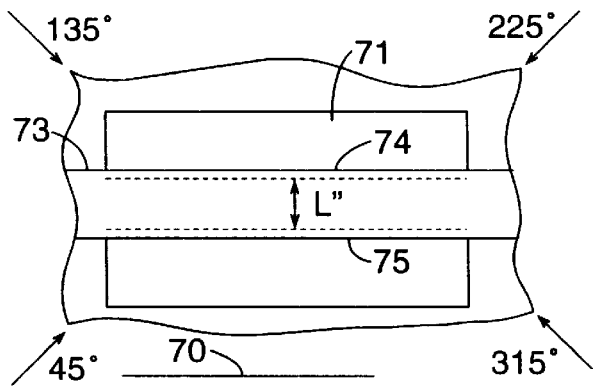
FIGS. 7 and 8 show, in plan, two portions of a silicon substrate each containing an active area and a gate electrode of a different shape, which have undergone implantation at four different orientations.

FIG. 7 shows a gate strip 73 formed on an active area 71 and delimited by two sides 74 and 75 parallel to a reference line 70 defined on the surface of the substrate. The substrate is subjected to implantation in four successive steps with changes in the orientation of the ion beams, that is, the angle between the perpendicular projection of the direction of the beam on the front surface and the reference line 70, from 45° to 315° in steps of 90°. The angle of inclination, the energy, and the dose of the ion beams, as well as the implantation time are kept unchanged for each step. It is clear and can easily be shown that, in these conditions, a uniform penetration of the dopant under the edges of the gate strip 73, as shown by a broken line in FIG. 7, and hence a constant channel length L" will be obtained. The same result is obtained if the gate strip 73 is oriented at 90° to the reference line.

Figure 8:
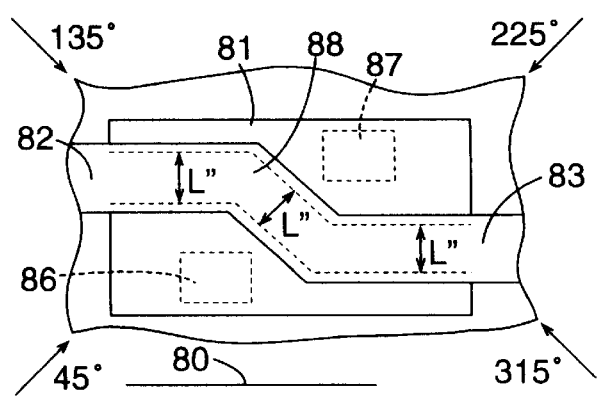

If, however, the gate strip 73 is oriented at a different angle, the same implantation steps with strips of equal width do not produce channels of equal length. If the gate strip is provided by parts oriented at different angles, channels of non-uniform length are thus obtained. For example, it is possible to consider a gate strip of uniform width provided by two portions 82 and 83 oriented parallel to a reference line 80 and connected to one another by an intermediate portion 88 inclined, for example, at 135° to the reference line 80, as shown in FIG. 8. This geometry is often used when the active area 81 is very small, since it leaves more space for the formation of source and drain contacts 86 and 87, indicated by broken lines in FIG. 8. It is easy to show that, since the intermediate portion 88 is exposed to beams oriented perpendicular thereto, it allows the dopant to penetrate a greater distance beneath its edges than is permitted by the portions 82 and 83 so that the channel under the intermediate portion 88 has a length L'" shorter than that, again indicated L", of the portions 82 and 83. The channel does not therefore have a uniform length under the whole of the gate electrode, as would be necessary for correct operation of the transistor.

Figure 9:
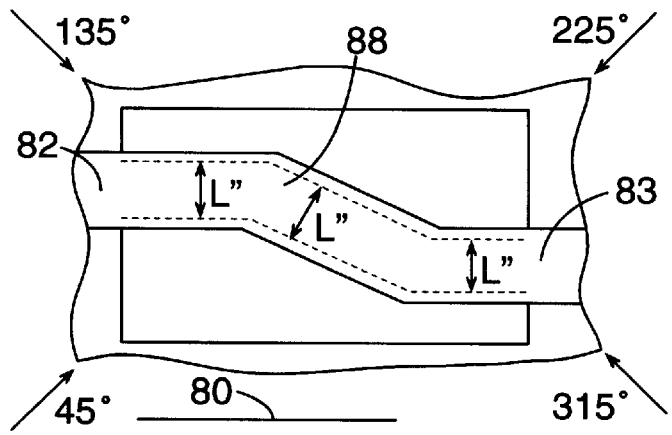
FIG. 9 shows, in plan, a portion of a silicon substrate containing an active area and a gate electrode formed by the method according to the invention.

According to the invention, to compensate for this non-uniformity which, according to the prior art, could be achieved only by a large number of implantation steps, the intermediate portion 88 is made wider than the two portions 82 and 83. The intermediate portion 88 is wider precisely to an extent such as to produce the same channel length, as shown in FIG. 9, in which the same reference numerals as in FIG. 8 are used to indicate corresponding elements. In general, according to the invention, the width of the gate strips or portions of gate strips are determined dependent on their orientation to the reference line and to the orientation of the ion beams in the various implantation steps.

The width of the gate strip is determined at the stage of the design of the topography of the integrated circuit comprising the transistors. The compensating adjustment of the width of the gate strip is derived from the geometrical considerations which are given below, after the following preliminary statement.

The depth of a junction produced by ion implantation depends on the distribution of dopant generated by the implantation and by any diffusion thereof as a result of heat treatments. The penetration of the implanted dopant in silicon can be expressed in terms of the projected "range" Rp. This commonly-used term defines the depth of the peak concentration of the dopant from the implantation surface before any diffusion heat treatment. Rp depends mainly on the species implanted and on the energy with which the beam is accelerated (ignoring effects, such as "channelling", connected with the relative orientations of beam and crystalline lattice).

The projected range can be used, with good approximation, as a parameter by which to assess and compare the different depths to which implantations performed at different orientations penetrate under the gates. The approximation is valid if the comparison is made between junctions produced with implantations of comparable doses, or if heat treatments are limited in terms of temperatures and times.

Figure 10:
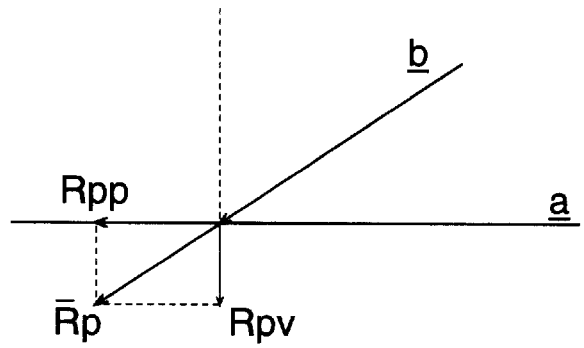
FIGS. 10 and 11 are schematic views of a silicon substrate which has undergone implantation, showing some geometrical relationships upon which the method according to the invention is based.

The geometrical considerations are as follows. If an implantation is not performed perpendicular to the surface a of the silicon but in a given direction b, it is possible to speak of vectors Rp and to separate two components, one Rpv perpendicular to the surface and one parallel thereto (FIG. 10). The component parallel to the surface of the penetration of a given species of dopant implanted in the silicon at a given energy is designated Rpp.

With reference to an implantation (FIG. 11) of which the projection b onto the surface is inclined at an angle θ to a reference axis c, the penetration of the dopant under a gate strip parallel to the axis will be:

$$x = Rpp * \sin \theta$$

Figure 11:
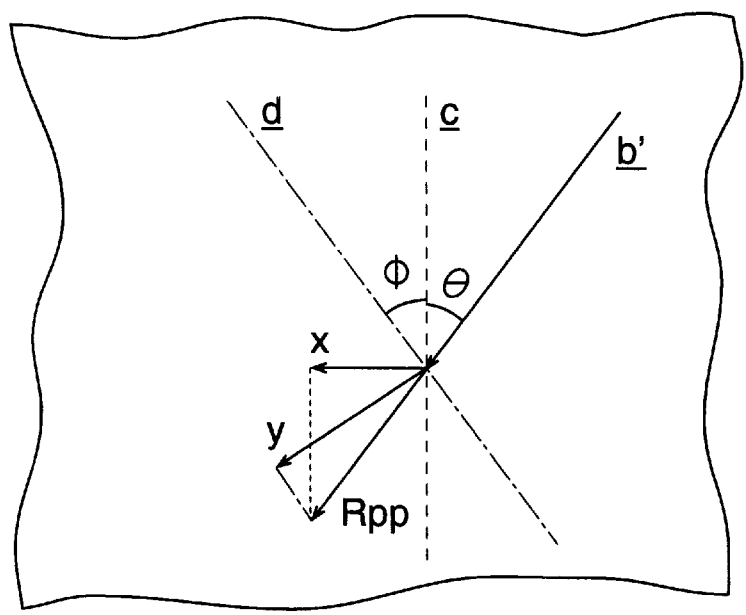

With reference to a second gate strip oriented in a different direction d in FIG. 11 so as to be inclined at an angle φ to the reference axis c, the penetration of this implant under the gate will be:

$$y = Rpp * \sin (\theta + \phi).$$

The difference in the penetration of a given implant under the two gate strips is:

$$\Delta L = Rpp[\sin \theta - \sin (\theta + \phi)]$$

In actual applications, it is necessary to extend this assessment to all of the directions involved in the implantation steps and, in particular, to consider the implants with maximum penetration. The directions of the ion beams in the various implantation steps are not necessarily intended to be spaced equiangularly (at 90° in the embodiment described) but could also be spaced by different angles.

The advantages of the method according to the invention are clear: by a simple modification of the rules which define the geometry of the gate electrodes, channels of uniform length are obtained with a much smaller number of implantation steps than would be necessary according to the prior art. This achieves savings in terms both of processing time and of the period of use of the equipment necessary for the implantation.

We claim:

1. A method of producing insulated-gate field-effect transistors on a substrate of semiconductor material comprising the steps of:
   forming at least one delimited area on a surface of the substrate;
   forming on the at least one delimited area, at least one gate electrode electrically insulated from the substrate; and
   subjecting the surface of the substrate to implantation of a dopant with ion beams to form in the substrate, on opposing sides of the at least one gate electrode, a pair of source and drain regions separated from one another by a channel and with the respective gate electrode being used as a mask, each ion beam coming from a predetermined direction defined by an angle of inclination to the surface of the substrate and an angle of orientation of a perpendicular projection of the predetermined direction on the surface relative to a reference line;
   wherein the at least one gate electrode comprises a plurality of portions with respective orientations and the forming of the at least one gate electrode comprises determining respective widths of the gate electrode portions in relation to the orientation of the portions relative to the reference line and in relation to the angle of orientation of each predetermined direction to produce a substantially uniform width channel, and wherein a difference between the angle of orientation of each predetermined direction and that of adjacent predetermined directions is less than 180°.

2. A method according to claim 1, wherein the step of subjecting comprises subjecting the surface of the substrate to implantation of the dopant with ion beams having substantially the same angle of inclination, energy, and dose.

3. A method according to claim 1, wherein there are three predetermined directions.

4. A method according to claim 1, wherein there are at least four predetermined directions.

5. A method according to claim 1, wherein there are four predetermined directions and the difference between the angle of orientation of each predetermined direction and that of the adjacent predetermined directions is about 90°.

6. A method of producing insulated-gate field-effect transistors on a substrate of semiconductor material comprising the steps of:
   forming at least one gate electrode, electrically insulated from the substrate, and comprising a plurality of portions with respective orientations;
   subjecting the substrate to implantation of a dopant with ion beams to form in the substrate, on opposing sides of the at least one gate electrode, a pair of source and drain regions separated from one another by a channel and with the respective gate electrode being used as a mask, each ion beam coming from a predetermined direction defined by an angle of inclination to the surface of the substrate and an angle of orientation of a perpendicular projection of the predetermined direction on the surface relative to a reference line; and
   determining respective widths of the portions of the at least one gate electrode, prior to forming same, based upon orientations thereof relative to the reference line and based on the angle of orientation of each predetermined direction, and wherein a difference between the angle of orientation of each predetermined direction and that of adjacent predetermined directions is less than 180°.

7. A method according to claim 6, wherein the determining step comprises determining respective widths of the gate electrode portions to produce a uniform width channel.

8. A method according to claim 6, wherein the step of subjecting comprises subjecting the surface of the substrate to implantation of the dopant with ion beams having substantially the same angle of inclination, energy, and dose.

9. A method according to claim 6, wherein there are three predetermined directions.

10. A method according to claim 6, wherein there are at least four predetermined directions.

11. A method according to claim 6, wherein there are four predetermined directions and the difference between the angle of orientation of each predetermined direction and that of the adjacent predetermined directions is about 90°.

12. A method of producing insulated-gate field-effect transistors on a substrate of semiconductor material comprising the steps of:
   forming at least one gate electrode, electrically insulated from the substrate, and comprising a plurality of portions with respective orientations;

subjecting the substrate to implantation of a dopant with ion beams to form in the substrate, on opposing sides of the at least one gate electrode, a pair of source and drain regions separated from one another by a channel and with the respective gate electrode being used as a mask, each ion beam coming from a predetermined direction defined by an angle of inclination to the surface of the substrate and an angle of orientation of a perpendicular projection of the predetermined direction on the surface relative to a reference line; and determining respective widths of the portions of the at least one gate electrode based upon orientations thereof relative to the reference line and based on the angles of orientation of each predetermined direction, and wherein the predetermined directions are at least three in number.

13. A method according to claim 12 wherein a difference between the angle of orientation of each predetermined direction and that of adjacent predetermined directions is less than 180°.

14. A method according to claim 12, wherein the determining step comprises determining respective widths of the gate electrode portions to produce uniform width channels.

15. A method according to claim 12, wherein the step of subjecting comprises subjecting the surface of the substrate to implantation of the dopant with ion beams having substantially the same angle of inclination, energy, and dose.

16. A method according to claim 12, wherein there are three predetermined directions.

17. A method according to claim 12, wherein there are at least four predetermined directions.

18. A method according to claim 12, wherein there are four predetermined directions and the difference between the angle of orientation of each predetermined direction and that of the adjacent predetermined directions is about 90°.

* * * * *